United States Patent
Zhang (10) Patent No.: US 9,071,275 B2
(45) Date of Patent: Jun. 30, 2015

(54) METHOD AND DEVICE FOR IMPLEMENTING CYCLIC REDUNDANCY CHECK CODES

(75) Inventor: Yulin Zhang, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 308 days.

(21) Appl. No.: 13/269,266

(22) Filed: Oct. 7, 2011

(65) Prior Publication Data

US 2012/0030548 A1    Feb. 2, 2012

Related U.S. Application Data

(63) Continuation of application No. PCT/CN2010/071603, filed on Apr. 7, 2010.

(30) Foreign Application Priority Data

Apr. 7, 2009   (CN) .......................... 2009 1 0132682

(51) Int. Cl.
*H03M 13/00*   (2006.01)
*H03M 13/09*   (2006.01)

(52) U.S. Cl.
CPC .................................. *H03M 13/091* (2013.01)

(58) Field of Classification Search
CPC .. H03M 13/09; H03M 13/091; H04L 1/0061; H04L 1/0057; H04L 1/0045
See application file for complete search history.

(56) References Cited

U.S. PATENT DOCUMENTS

| | | | |
|---|---|---|---|
| 6,519,738 B1 * | 2/2003 | Derby | 714/781 |
| 6,912,683 B2 * | 6/2005 | Rifaat et al. | 714/774 |
| 7,171,604 B2 * | 1/2007 | Sydir et al. | 714/758 |
| 7,363,574 B1 * | 4/2008 | Maitland et al. | 714/759 |
| 2005/0138523 A1 * | 6/2005 | Leonard et al. | 714/758 |
| 2005/0213463 A1 * | 9/2005 | Sakagami | 369/59.11 |
| 2005/0268209 A1 * | 12/2005 | Mann | 714/776 |

(Continued)

FOREIGN PATENT DOCUMENTS

| | | |
|---|---|---|
| CN | 1431594 A | 7/2003 |
| CN | 201153259 Y | 11/2008 |
| CN | 101527615 A | 9/2009 |

OTHER PUBLICATIONS

Written Opinion of the International Searching Authority issued in corresponding PCT Patent Application No. PCT/CN2010/071603, mailed Jul. 15, 2010.

(Continued)

*Primary Examiner* — Albert Decady
*Assistant Examiner* — Enamul M Kabir
(74) *Attorney, Agent, or Firm* — Brinks Gilson & Lione (57) ABSTRACT

The present invention relates to an error control technology in the communication system and discloses a method and an apparatus for implementing Cyclic Redundancy Check (CRC) codes to improve the operation performance of the system significantly and satisfy operation requirements when processing high-rate CRC data. The method includes: performing at least one XOR operation for information bits input in parallel to obtain a first result, where at least one pipeline is added during the XOR operation; performing an XOR operation for a previously obtained CRC code to obtain a second result; and performing an XOR operation for the second result and the first result to obtain a current CRC code. The present invention is applicable to any field that needs to implement CRC codes by means of hardware.

5 Claims, 4 Drawing Sheets

(56) References Cited

U.S. PATENT DOCUMENTS

| | | | |
|---|---|---|---|
| 2007/0150795 A1* | 6/2007 | King et al. | 714/781 |
| 2007/0234177 A1* | 10/2007 | Jeon et al. | 714/758 |
| 2008/0168323 A1* | 7/2008 | Clark et al. | 714/758 |
| 2008/0195915 A1* | 8/2008 | Leonard et al. | 714/757 |
| 2008/0244361 A1* | 10/2008 | Walma | 714/758 |
| 2009/0222667 A1* | 9/2009 | Vauclair et al. | 713/175 |

OTHER PUBLICATIONS

International Search Report issued in corresponding PCT Patent Application No. PCT/CN2010/071603, mailed Jul. 15, 2010.
Office Action issued in corresponding Chinese Patent Application No. 200910132682.0, mailed Apr. 25, 2011.
Office Action issued in corresponding Chinese Patent Application No. 200910132682.0, mailed Oct. 26, 2011.

* cited by examiner

METHOD AND DEVICE FOR IMPLEMENTING CYCLIC REDUNDANCY CHECK CODES

CROSS-REFERENCE TO RELATED APPLICATIONS

This application is a continuation of International Application No. PCT/CN2010/071603, filed on Apr. 7, 2010, which claims priority to Chinese Patent Application No. 200910132682.0, filed on Apr. 7, 2009. The afore-mentioned patent applications are hereby incorporated by reference in their entireties.

FIELD OF THE INVENTION

The present invention relates to error control technologies in a communication system, and in particular, to a method and an apparatus for implementing Cyclic Redundancy Check (CRC) codes.

BACKGROUND OF THE INVENTION

Error control needs to be exercised on the communication process to ensure correct data transmission in a communication system. CRC is characterized by simple coding and low misjudging rate and is an error control mode commonly used in the communication system.

CRC codes are a branch of linear block codes, and the basic principle is as follows: With a line ar coding theory being used, an r-bit check code (namely, a CRC code) is generated according to a k-bit information sequence to be transmitted on the transmitting end and by using a certain rule, the CRC code is appended to the original information bits to make up a new sequence composed of (k+r) bits, and the new sequence that includes the CRC code is sent; on the receiving end, it is checked, according to the rule between the information bits and the CRC code, whether an error occurs in the transmission process.

For example, if a k-bit binary information sequence composed of information bits to be transmitted is D={d[p−1]d[p−2] . . . d[1]d[0]}, the CRC works in this way: Sequence D is shifted leftward by r bits, the shifted sequence D is divided by a generator polynomial composed of (r+1) bits to obtain an r-bit remainder function R={r[r−1]r[r−2] . . . r[1]r[0]}, the remainder function R is used as a CRC code of the sequence D, and a new binary sequence M={d[p−1]d[p−2] . . . d[1]d[0]r[r−1]r[r−2] . . . r[1]r[0]} composed of (k+r) bits is generated for transmission.

Figure 1A:
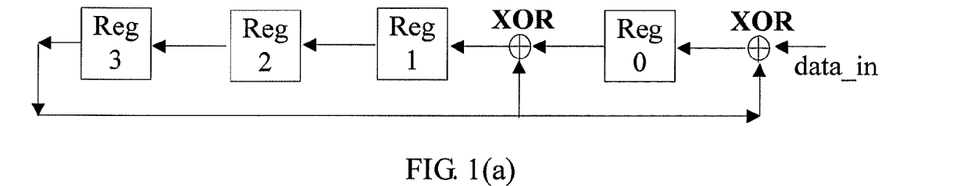
FIG. 1(a) is a schematic diagram showing a serial circuit for implementing CRC codes.
Figure 1B:
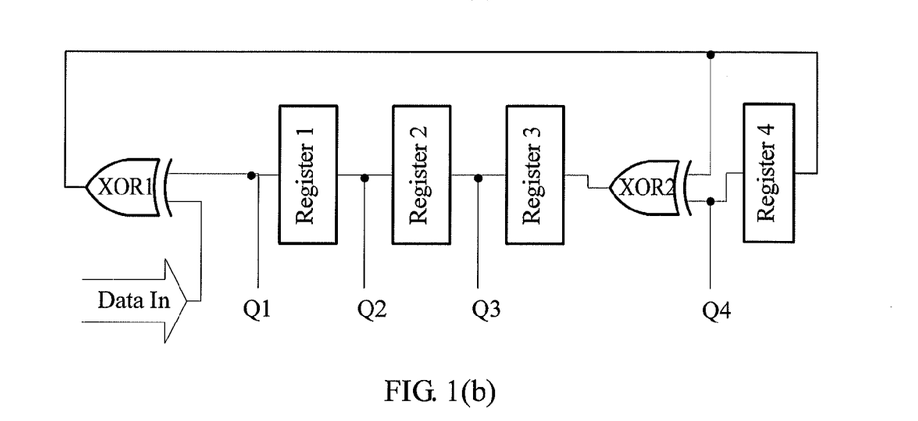
FIG. 1(b) is a schematic diagram showing another serial circuit for implementing CRC codes.

In actual application, CRC codes can be implemented by logic circuits of hardware. Typically, there are two kinds of the logic circuits: a serial circuit and a parallel circuit. The serial circuit calculates a CRC code bit by bit. For example, as shown in FIG. 1(a), for a 4-bit CRC code (CRC-4), the four registers are reset to 0, and then information elements in an information sequence are used as input data, and the information elements are input serially in a shift mode, namely, one information bit element is input in every clock cycle. After four clock cycles, the first four information bits of the information element are all input into the registers. Subsequently, data in the registers move leftward bit by bit, and an XOR operation is performed for the data in the registers and a CRC code is calculated. Supposing that a generator polynomial of CRC-4 is $x^4+x+1$, FIG. 1(b) shows a serial circuit without waiting for shifting the information elements into the register before calculating the CRC code.

Figure 2:
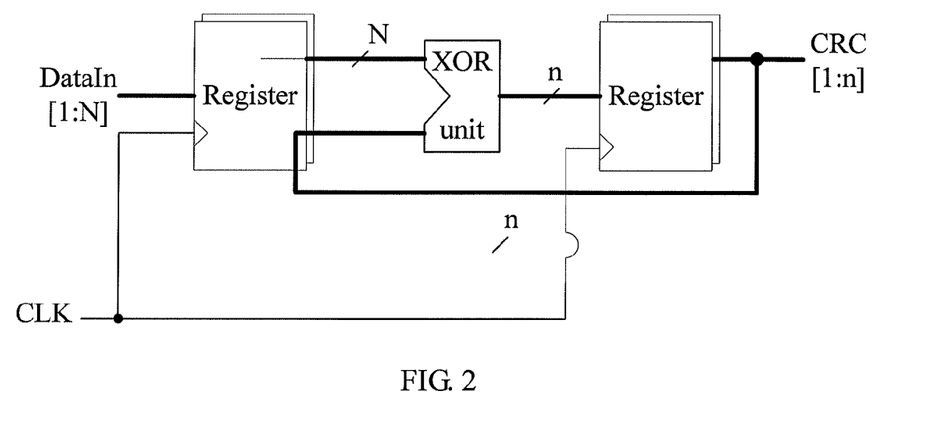
FIG. 2 is a schematic diagram showing a general parallel circuit for implementing CRC codes.

The implementation of a parallel circuit is based on the preceding serial circuit. The principle of the parallel circuit is as follows: The CRC remainder generated at the time of inputting n information bits into the parallel circuit simultaneously is the same as the CRC remainder generated at the time of inputting n information bits into the serial circuit bit by bit; therefore, the parallel circuit may be regarded as equivalent to the serial circuit, and a logical relation expression of the parallel circuit can be obtained according to the registers in the serial circuit and changes of the input information bits. Through the parallel circuit, n information bits to be transmitted can be input at a time. After n information bits are input repeatedly, the CRC code of the information sequence may be finally obtained. FIG. 2 shows a general parallel circuit.

In the process of implementing the present invention, the inventor finds at least the following problems in the prior art:

Based on a line feedback shift register in the prior art, the serial circuit can shift only one bit in each clock cycle, which is rather inefficient; such serial circuits can be applicable to only low-rate CRC check circuit that imposes a low requirement on performance, and cannot be applicable to the CRC that requires high rates to perform data check.

In the prior art, when a parallel circuit processes multiple bits in parallel, with the increase of the bit width of parallel data, deeper layers of the XOR logic circuit are used by the parallel circuit. Consequently, the corresponding circuit delay is greater, and the clock frequency of the circuit is lower. The operation performance or data throughput of a circuit is in direct proportion to the clock frequency of the circuit and the bit width of data. The prior art decreases the clock frequency of the circuit when increasing the bit width of data being processed, and is incapable of improving the circuit performance or increasing the data throughput linearly by increasing the bit width of parallel data linearly. Furthermore, the parallel circuit in the prior art is incapable of processing high-rate CRC data.

SUMMARY OF THE INVENTION

To solve the problems in the prior art, embodiments of the present invention provide a method and an apparatus for implementing CRC codes. By using the method and apparatus, the operation efficiency of the system can be improved significantly and operation requirements can be satisfied when processing high-rate CRC data.

To achieve the preceding objectives, the following technical solution is adopted in embodiments of the present invention:

A method for implementing CRC codes includes:

performing an XOR operation at least once for information bits input in parallel to obtain a first result, where at least one pipeline is added during the XOR operation;

performing an XOR operation for a previously obtained CRC code to obtain a second result; and performing an XOR operation for the second result and the first result to obtain a current CRC code.

An apparatus for implementing CRC codes includes:

an information bit XOR unit, configured to perform an XOR operation at least once for information bits input in parallel to obtain a first result, where at least one pipeline is added during the XOR operation;

a CRC code XOR unit, configured to perform an XOR operation for a previously obtained CRC code to obtain a second result; and a CRC code obtaining unit, configured to perform an XOR operation for the first result obtained by the information bit XOR unit and the second result obtained by the CRC XOR unit to obtain a current CRC code.

The technical solution provided in embodiments of the present invention can process multiple information bits in parallel; in the parallel processing, at least one pipeline is added in XOR operations of information bits. Therefore, the clock frequency of the system is increased, and the operation performance of the system is improved linearly with the linear increase of the bit width of data being processed. The technical solution solves the problems in the prior art: A serial circuit in the prior art can process only a single bit in each clock cycle, and a parallel circuit in the prior art is incapable of improving the operation performance of the system linearly with linear increase of the bit width of data being processed. The technical solution provided in embodiments of the present invention can improve the operation performance of the system significantly when implementing CRC codes, and can satisfy operation requirements when processing high-rate CRC data.

BRIEF DESCRIPTION OF THE DRAWINGS

To make the technical solution in embodiments of the present invention or in the prior art clearer, the following briefly describes the accompanying drawings involved in the description of the embodiments or the prior art. Obviously, the accompanying drawings described in the following are merely exemplary embodiments of the present invention, and persons of ordinary skill in the art may also derive other drawings from such accompanying drawings without any creative effort.

DETAILED DESCRIPTION OF THE EMBODIMENTS

To make the technical solution in embodiments of the present invention clearer, the following describes the embodiments of the present invention with reference to accompanying drawings in detail. Obviously, the embodiments described in the following are merely exemplary embodiments of the present invention, and persons of ordinary skill in the art may also derive other embodiments of the present invention from such embodiments without creative efforts.

Figure 3:
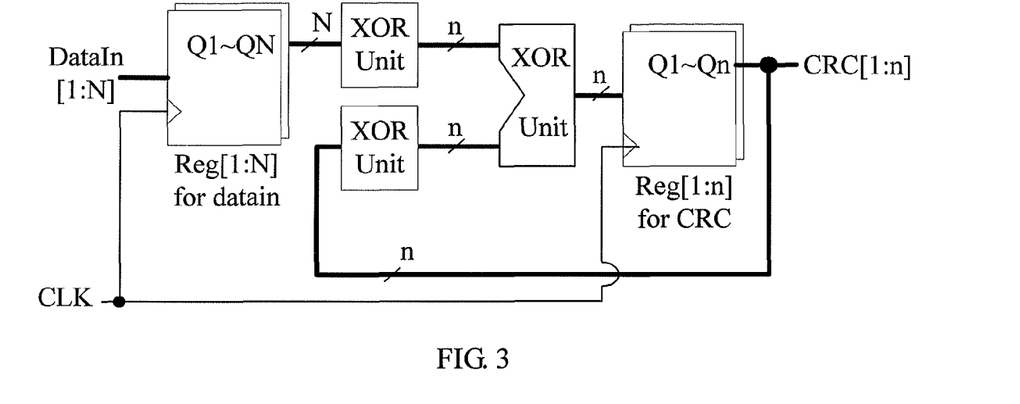
FIG. 3 is a schematic diagram showing another parallel circuit for implementing CRC codes.

In embodiments of the present invention, a parallel circuit is adopted to implement CRC codes. The parallel circuit provided in the embodiments of the present invention includes a data XOR operation circuit and a CRC XOR logic circuit. As shown in FIG. 3, the parallel circuit uses the data XOR operation circuit to perform an XOR operation for the corresponding input data, and uses a CRC XOR logic circuit to perform an XOR operation for a previously obtained CRC code, and then performs an XOR operation for the results of the two XOR operations to obtain a current CRC code. By adding at least one pipeline circuit into the data XOR operation circuit of the parallel circuit, the embodiments of the present invention improve the operation performance of the system significantly.

To make the technical solution provided in embodiments of the present invention clearer, the following describes the working principle of the parallel circuit, supposing that the generator polynomial of CRC-4 is $x^4+x+1$. Considering that the effect of the parallel circuit is equivalent to that of the serial circuit, as shown in FIG. 1(b), if initial data in the registers is (d1, d2, d3, d4) respectively, input data is (a1, a2, a3, a4). The following table shows regular changes of the values of the registers in different clock cycles of the circuit when 4 bits are input in parallel:

TABLE 1

| | Regular changes of values of registers | | | |
|---|---|---|---|---|
| | Register | | | |
| Cycle | D1 | D2 | D3 | D4 |
| 0 (initial) | d1 | d2 | d3 | d4 |
| 1 | d2 | d3 | d4□d1□a1 | d1□a1 |
| 2 | d3 | d4□d1□a1 | d1□d2□a1□a2 | d2□a2 |
| 3 | d4□d1□a1 | d1□d2 ⊕ a1□a2 | d2□d3□a2 ⊕ a3 | d3□a3 |
| 4 | d1□d2□a1□a2 | d2□d3 ⊕ a2□a3 | d1□d3□d4□a1□a3□a4 | d4□d1□a1□a4 |

As shown in the table, if the input 4-bit data is (a1, a2, a3, a4), after 4 clock cycles elapse, a CRC code calculated in registers 1-4 is equal to a group of XOR values of the input data (a1, a2, a3, a4) and the initial data (d1, d2, d3, d4). Under this circumstance, if the CRC code serves as the initial values of registers and performs the same CRC-4 calculation with subsequent 4-bit data (a5, a6, a7, a8), after another 4 clock cycles elapse, the result values in the registers recur according to the regularity as shown in Table 1.

As analyzed in the preceding, if N bits are input in parallel in each parallel calculation, the prerequisite for generating a correct CRC code for an M-bit data sequence is: M can be divisible by N, namely, (M/N)=K, where K is a positive integer (or an (M−N*K)-bit parallel CRC operation circuit is applied after the last (M−N*K) bits to obtain a final CRC code).

In the example as illustrated in Table 1, when a length of an input data sequence is an integral multiple of 4 bits, every 4 bits in the data sequence may be calculated in a cycle through multiple XOR operations according to the logical relation in the fourth cycle in Table 1; the calculation result serves as an initial value for calculating the subsequent 4-bit data, thus implementing the parallel calculation where 4 bits are input.

After the data of last 4 bits is input, the final CRC value of this data sequence may be obtained through the last operation. For example, at the time of inputting the initial 4-bit data sequence, the initial values in registers 1-4 are all 0s, and the input data sequence is "1010, 1100". After the first 4 bits "1010" are input, the following calculation is performed according to the logical relation in the fourth cycle in Table 1 to obtain the result values (D1, D2, D3, D4) of registers 1-4:

| | | |
|---|---|---|
| D1 <= d1 ⊕ d2 ⊕ a1 ⊕ a2 | = 0 ⊕ 0 ⊕ 1 ⊕ 0 | = 1 |
| D2 <= d2 ⊕ d3 ⊕ a2 ⊕ a3 | = 0 ⊕ 0 ⊕ 0 ⊕ 1 | = 1 |
| D3 <= d1 ⊕ d3 ⊕ d4 ⊕ a1 ⊕ a3 ⊕ a4 | = 0 ⊕ 0 ⊕ 0 ⊕ 1 ⊕ 1 ⊕ 0 | = 0 |
| D4 <= d4 ⊕ d1 ⊕ a1 ⊕ a4 | = 0 ⊕ 0 ⊕ 1 ⊕ 0 | = 1 |

Then, the bits "1100" are input, and the following calculation is performed in the same way:

| | | |
|---|---|---|
| D1 <= d1 ⊕ d2 ⊕ a1 ⊕ a2 | = 1 ⊕ 1 ⊕ 1 ⊕ 1 | = 0 |
| D2 <= d2 ⊕ d3 ⊕ a2 ⊕ a3 | = 1 ⊕ 0 ⊕ 1 ⊕ 0 | = 0 |
| D3 <= d1 ⊕ d3 ⊕ d4 ⊕ a1 ⊕ a3 ⊕ a4 | = 1 ⊕ 0 ⊕ 1 ⊕ 1 ⊕ 0 ⊕ 0 | = 1 |
| D4 <= d4 ⊕ d1 ⊕ a1 ⊕ a4 | = 1 ⊕ 1 ⊕ 1 ⊕ 0 | = 1 |

Through the preceding calculations, the final CRC code "0011" is obtained. According to the preceding calculating regularity, it may be concluded as follows:

| | |
|---|---|
| D1 <= d1 ⊕ d2 ⊕ a1 ⊕ a2 | is equivalent to D1 <= (d1 ⊕ d2) ⊕ (a1 ⊕ a2) |
| D2 <= d2 ⊕ d3 ⊕ a2 ⊕ a3 | is equivalent to D2 <= (d2 ⊕ d3) ⊕ (a2 ⊕ a3) |
| D3 <= d1 ⊕ d3 ⊕ d4 ⊕ a1 ⊕ a3 ⊕ a4 | is equivalent to D3 <= (d1 ⊕ d3 ⊕ d4) ⊕ (a1 ⊕ a3 ⊕ a4) |
| D4 <= d4 ⊕ d1 ⊕ a1 ⊕ a4 | is equivalent to D4 <= (d4 ⊕ d1) ⊕ (a1 ⊕ a4) |

Therefore, a parallel circuit includes a data XOR operation circuit and a CRC XOR logic circuit. When implementing a CRC-code process, the input data undergoes an XOR operation in the data XOR operation circuit first, and the result of the previous XOR operation undergoes an XOR operation in the CRC XOR logic circuit once more. At last, perform an XOR operation for the two results of the previous two XOR operations, and a current CRC code is obtained.

Figure 4:
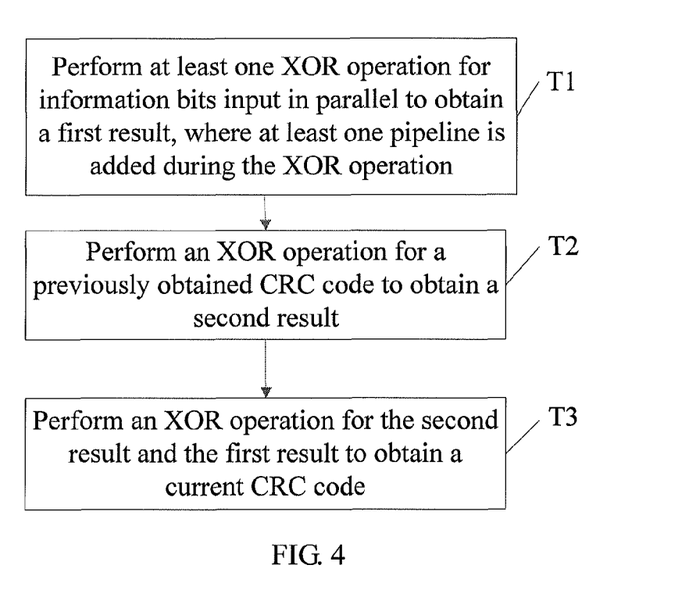
FIG. 4 is a flowchart of a method for implementing CRC codes according to an embodiment of the present invention.

Based on the preceding parallel circuit, a method for implementing CRC codes is provided in an embodiment of the present invention. The method includes the following steps:

Step T1: Perform at least one XOR operation for information bits input in parallel to obtain a first result, where at least one pipeline is added during the XOR operation.

In this embodiment of the present invention, at least one XOR operation is performed for the input information bits, and at least one pipeline is added during the XOR operation. The XOR operation can be performed through an XOR operator directly, but is not limited to this. The same XOR result may also be obtained through logic operations composed of any combination of AND operation, OR operation, and NOT operation. In this embodiment, a direct XOR operation is preferred.

Information bits here refer to the information bits determined for an XOR operation currently by a CRC generator polynomial. For example, in the preceding example, when the initial 4 bits of information bits (a1, a2, a3, a4) are input, the information bits determined for an XOR operation currently in register 1 are a1 and a2. Therefore, a1 and a2 undergo XOR operations, where at least one pipeline is added in the XOR operation. In this way, a first result is obtained.

The XOR operation here refers to a single operation or multiple operations. When a large number of information bits are input in parallel, multiple XOR operations need to be performed, and at least one pipeline is added in the multiple XOR operations. By adding at least one pipeline directly in the XOR operations, the clock frequency of the system is increased significantly. Therefore, the operation performance of the system is improved. This method is especially applicable to a complicated CRC code operation circuit that needs to process many bits in parallel.

Optionally, the method provided in this embodiment of the present invention further includes: adding at least one pipeline to the first result obtained.

According to system requirements, the first result obtained may be pipelined for at least one time. The number of pipeline processes is not limited, and may be set according to the conditions of the system. For example, when the clock frequency of the parallel circuit is reduced drastically, multiple pipelines may be set to improve the system performance.

Furthermore, for a CRC operation that involves few logical layers, the method provided in this embodiment of the present invention includes: performing only a corresponding XOR operation for the preceding information bits, adding at least one pipeline to the result of the XOR operation, and using the obtained result as a first result. This method can also increase the clock frequency of the system, and is applicable to a CRC operation circuit that needs to process few bits in parallel.

It should be noted that the pipelining is intended for information bits only, namely, a pipeline is added to only the data XOR operation circuit in the parallel circuit. That is because the operation result of the previous CRC code needs to be used in the CRC XOR logic circuit, namely, a feedback loop exists in the CRC XOR logic circuit so that a pipeline cannot be added to the circuit, and the CRC XOR logic circuit does not affect the operation performance of the system with the increase of bit width of input information bits.

At the time of pipelining, the clock frequency of the system is not increased, in consideration that a pipeline is appended to a storage unit such as a register directly in the circuit, if the pipelining is performed on the accessed register already. Therefore, an XOR operation is required before the pipelining.

Step T2: Perform an XOR operation for a previously obtained CRC code to obtain a second result.

The previously obtained CRC code refers to the previously obtained CRC code determined for an XOR operation currently by a CRC generator polynomial. For example, in the preceding example, when the second 4-bit sequence (a5, a6, a7, a8) is input, the previously obtained CRC code determined for the XOR operation currently in register 1 is d1 and d2.

Step T3: Perform an XOR operation for the second result and the first result to obtain a current CRC code.

The current CRC code is an XOR value of the first result and the second result.

Because insertion of a pipeline causes the data operation result to delay for a clock cycle, the same level of pipeline needs to be added to all XOR operation circuits that involve parallel input to ensure synchronization of data calculation results between the XOR operations. Under this circumstance, the method in this embodiment of the present invention further includes: adding at least one pipeline to the determined information bits that are input in parallel; and performing an operation for the pipelined information bits and the previously obtained CRC code to obtain a synchronized current CRC code.

Taking an 8-bit CRC-16 (whose generator polynomial is $x^{16}+x^{15}+x^2+1$) as an example, the following describes a parallel CRC operation circuit to which a pipeline circuit can be added in detail. According to the preceding description, the logical relation expression of a parallel 8-bit CRC-16 is given in the following, where information bits input in parallel may be expressed as d[7:0]; a previously calculated CRC code or initial value is expressed as c[15:0]; a currently calculated CRC value is next_crc[15:0], a finally output CRC code is c_out[15:0], and a symbol "^" represents an XOR operation:

next_crc[0]=d[7]^d[6]^d[5]^d[4]^d[3]^d[2]^d[1]^d[0]^c[8]^c[9]^c[10]^c[11]^c[12]^c[13]^c[14]^c[15];

next_crc[1]=d[7]^d[6]^d[5]^d[4]^d[3]^d[2]^d[1]^c[9]^c[10]^c[11]^c[12]^c[13]^c[14]^c[15];

next_crc[2]=d[1]^d[0]^c[8]^c[9];

next_crc[3]=d[2]^d[1]^c[9]^c[10];

next_crc[4]=d[3]^d[2]^c[10]^c[11];

next_crc[5]=d[4]^d[3]^c[11]^c[12];

next_crc[6]=d[5]^d[4]^c[12]^c[13];

next_crc[7]=d[6]^d[5]^c[13]^c[14];

next_crc[8]=d[7]^d[6]^c[0]^c[14]^c[15];

next_crc[9]=d[7]^c[1]^c[15];

next_crc[10]=c[2];

next_crc[11]=c[3];

next_crc[12]=c[4];

next_crc[13]=c[5];

next_crc[14]=c[6];

next_crc[15]=d[7]^d[6]^d[5]^d[4]^d[3]^d[2]^d[1]^d[0]^c[7]^c[8]^c[9]^c[10]^c[11]^c[12]^c[13]^c[14]^c[15].

Taking a CRC code next_crc[0] as an example, according to the preceding relation expression, the CRC procedure determines that an XOR operation needs to be performed for next_crc[0] in parallel and the information bits include d[0] to d[7], and adds at least one pipeline in the process of the XOR operation of the information bits. For example, in the case that one pipeline is added, the CRC procedure may perform an XOR operation for a part of d[0] to d[7] (such as d[0] to d[4]) first, adds a pipeline to the XOR operation result, and then perform an XOR operation for the remaining information bits (such as d[5] to d[7]). In the case that multiple pipelines are added, the determined information bits may be divided into multiple parts, and XOR operations are performed for these parts respectively.

Figure 5:
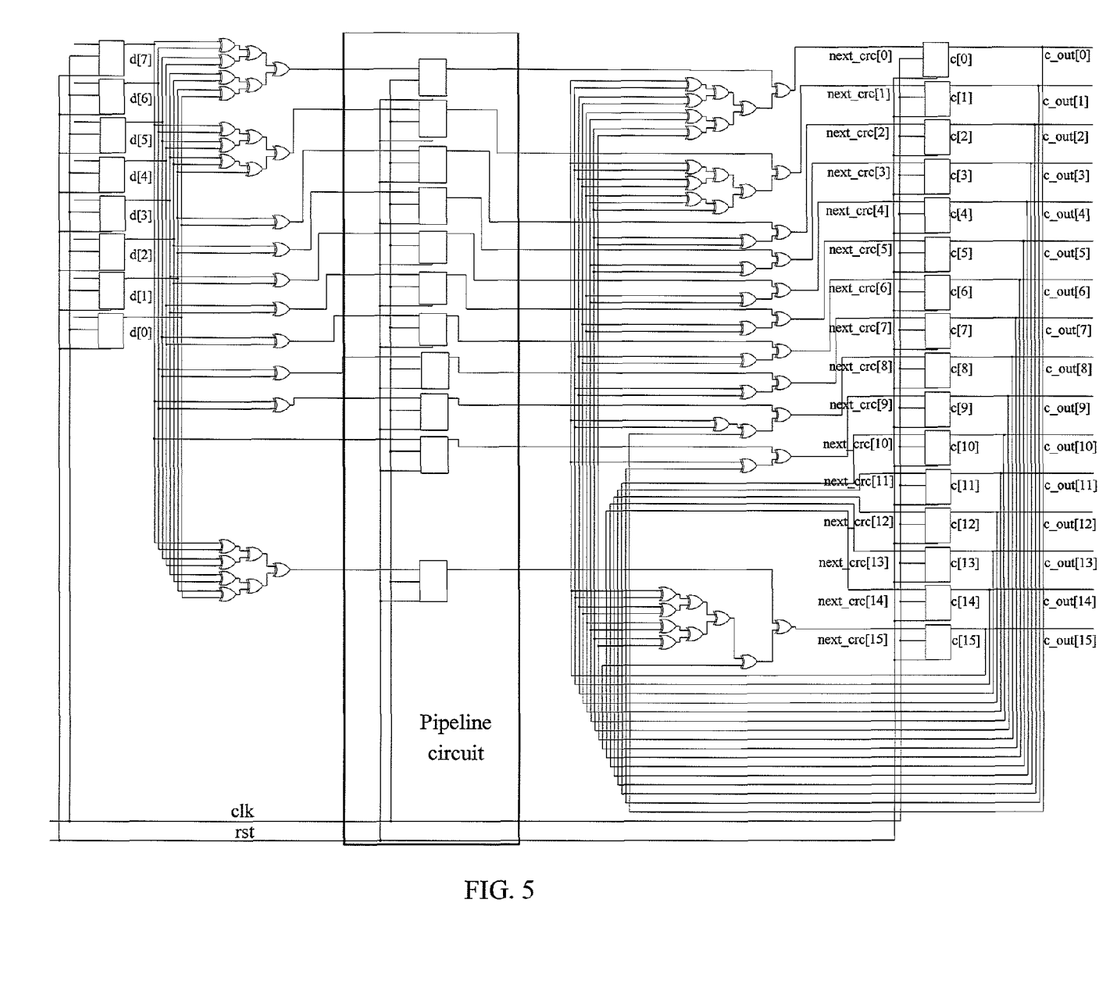
FIG. 5 is a schematic diagram showing a circuit for implementing 8-bit parallel input according to an embodiment of the present invention.

A schematic diagram of a logic circuit for implementing the preceding CRC codes is provided in an embodiment of the present invention. As shown in FIG. 5, the part indicated by the box may be implemented by registers, and the parallel circuit is mainly implemented by registers and XOR operators. Because the deepest layer of the data XOR operation circuit in the parallel circuit is layer 3, namely, few layers exist, one level of pipeline may be added to the whole data XOR operation circuit to improve the system performance. FIG. 5 shows a process of adding one level of pipeline after an XOR operation for all input information bits is performed. The structure and the components of the circuit are not limited here, and the CRC codes may be implemented through any practicable circuit according to the method provided in this embodiment of the present invention.

It should be noted that although only information bit d[7] is involved in the operation of next_crc[9]=d[7]^c[1]^c[15] implemented in FIG. 5, one level of pipeline circuit also needs to be inserted to ensure synchronization of data.

The technical solution provided in embodiments of the present invention can process multiple information bits in parallel; in the parallel processing, at least one pipeline is added to XOR operations of information bits. Therefore, the clock frequency of the system is increased, and the operation performance of the system is improved linearly with the linear increase of the bit width of data being processed. The technical solution solves the problems in the prior art: A serial circuit in the prior art can process only a single bit in each clock cycle, and a parallel circuit in the prior art is incapable of improving the operation performance of the system linearly with linear increase of the bit width of data being processed. The technical solution provided in embodiments of the present invention can improve the operation performance of the system significantly when implementing CRC codes, and can satisfy operation requirements when processing high-rate CRC data.

Figure 6:
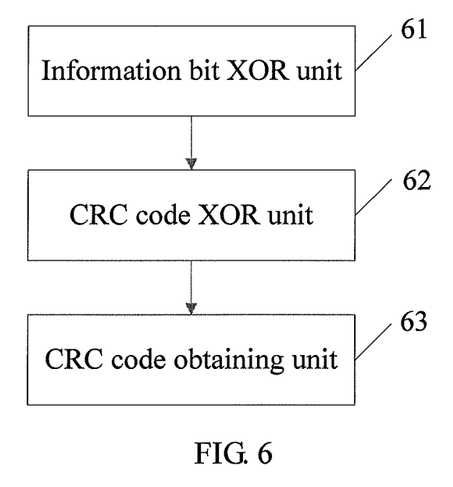
FIG. 6 is a schematic structural diagram of an apparatus for implementing CRC codes according to an embodiment of the present invention.

An apparatus for implementing CRC codes is provided in an embodiment of the present invention. As shown in FIG. 6, the apparatus includes:

an information bit XOR unit 61, configured to perform at least one XOR operation for information bits input in parallel to obtain a first result, where at least one pipeline is added during the XOR operation;

a CRC code XOR unit 62, configured to perform an XOR operation for a previously obtained CRC code to obtain a second result; and a CRC code obtaining unit 63, configured to perform an XOR operation for the first result obtained by the information bit XOR unit 61 and the second result obtained by the CRC code XOR unit 62 to obtain a current CRC code.

Furthermore, the preceding apparatus includes a pipelining unit 64, configured to add at least one pipeline to the first result obtained by the information bit XOR unit 61.

The preceding apparatus for implementing CRC codes may be implemented by a hardware circuit. For example, an information bit XOR unit may be implemented by an XOR operator and a register; a CRC code XOR unit and a CRC code obtaining unit may be implemented by XOR operators; and a pipelining unit may be implemented by a register. FIG. 5 shows a circuit for inserting one level of pipeline when inputting 8 bits in parallel. For the detailed working mode of the functional modules in the preceding apparatus, see the method provided in embodiments of the present invention.

The technical solution provided in embodiments of the present invention can process multiple information bits in parallel; in the parallel processing, at least one pipeline is added to XOR operations of information bits. Therefore, the clock frequency of the system is increased, and the operation performance of the system is improved linearly with the linear increase of the bit width of data being processed. The technical solution solves the problems in the prior art: A serial circuit in the prior art can process only a single bit in each clock cycle, and a parallel circuit in the prior art is incapable of improving the operation performance of the system linearly with linear increase of the bit width of data being processed. The technical solution provided in embodiments of the present invention can improve the operation performance of the system significantly when implementing CRC codes, and can satisfy operation requirements when processing high-rate CRC data.

Persons of ordinary skill in the art may understand that all or part of the steps of the method according to the embodiments of the present invention may be implemented by a program instructing relevant hardware. The software corresponding to the embodiments may be stored in a computer readable storage medium.

The preceding descriptions are merely exemplary embodiments of the present invention, but not intended to limit the scope of the present invention. Any variations or replacements that can be easily derived by those skilled in the art shall fall within the protection scope of the present invention. Therefore, the protection scope of the present invention shall be subject to the appended claims.

What is claimed is:

1. A method for implementing Cyclic Redundancy Check (CRC) codes, comprising:
   performing at least one Boolean XOR operation for information bits input in parallel to obtain a first result;
   adding at least one pipeline for only the information bits during the XOR operation wherein a number of the added pipeline is determined according to a system performance condition comprising a clock frequency change;
   performing an XOR operation for a previously obtained CRC code to obtain a second result; and
   performing an XOR operation for the second result and the first result to obtain a current CRC code.

2. The method according to claim 1, further comprising: adding at least one pipeline to the first result.

3. The method according to claim 1, further comprising: using a CRC code generator polynomial to determine the information bits and CRC codes.

4. An apparatus for implementing Cyclic Redundancy Check (CRC) codes, comprising:
   an information bit XOR unit configured to perform at least one Boolean XOR operation for information bits input in parallel to obtain a first result, wherein at least one pipeline is added for only the information bits during the XOR operation wherein a number of added pipeline is determined according to a system performance condition comprising a clock frequency change;
   a CRC code XOR unit configured to perform an XOR operation for a previously obtained CRC code to obtain a second result; and
   a CRC code obtaining unit configured to perform an XOR operation for the first result obtained by the information bit XOR unit and the second result obtained by the CRC code XOR unit to obtain a current CRC code.

5. The apparatus according to claim 4, further comprising: a pipelining unit configured to add at least one pipeline to the first result obtained by the information bit XOR unit.

* * * * *